(12) United States Patent
Yuen et al.

(10) Patent No.: US 6,905,800 B1
(45) Date of Patent: Jun. 14, 2005

(54) ETCHING A SUBSTRATE IN A PROCESS ZONE

(76) Inventors: Stephen Yuen, 2435 Ruth Cabral Way, Santa Clara, CA (US) 95050; Mohit Jain, 3301 Monroe St., #3, Santa Clara, CA (US) 95051; Thorsten B. Lill, 880 E. Fremont Ave. #634, Sunnyvale, CA (US) 94087

( * ) Notice: Subject to any disclaimer, the term of this patent is extended or adjusted under 35 U.S.C. 154(b) by 359 days.

(21) Appl. No.: 09/718,319

(22) Filed: Nov. 21, 2000

(51) Int. Cl.[7] .................................................. H01L 21/302
(52) U.S. Cl. ..................... 430/5; 438/714; 438/725; 438/717; 438/736; 438/738; 438/723; 438/724; 134/1.2; 134/1.3
(58) Field of Search .............................. 438/714, 725, 438/717, 736, 738, 723, 724; 134/1.2, 1.3; 430/5

(56) References Cited

U.S. PATENT DOCUMENTS

| | | | |
|---|---|---|---|
| 4,282,267 A | 8/1981 | Kuyel | 427/38 |
| 4,433,228 A | 2/1984 | Nishimatsu et al. | 219/10.55 R |
| 4,465,532 A | 8/1984 | Fukano | 156/643 |
| 4,490,209 A | 12/1984 | Hartman | 156/643 |
| 4,502,914 A | 3/1985 | Trumpp et al. | 156/643 |
| 4,576,692 A | 3/1986 | Fukuta et al. | 204/165 |
| 4,705,595 A | 11/1987 | Okudaira et al. | 156/643 |
| 4,738,748 A | 4/1988 | Kisa | 156/643 |
| 4,786,352 A | 11/1988 | Benzing | 156/345 |
| 4,818,326 A | 4/1989 | Liu et al. | 156/345 |
| 4,831,963 A | 5/1989 | Saito et al. | 118/723 |
| 4,863,561 A | 9/1989 | Freeman et al. | 156/646 |
| 4,867,841 A | 9/1989 | Loewenstein et al. | 156/643 |

(Continued)

FOREIGN PATENT DOCUMENTS

| | | |
|---|---|---|
| DE | 4132559 | 4/1993 |
| EP | 0272143 | 6/1988 |
| EP | 0314990 | 5/1989 |
| EP | 0463373 | 1/1992 |
| EP | 0516043 | 12/1992 |
| EP | 0555546 | 8/1993 |
| EP | 0697467 | 2/1996 |
| EP | 0746015 | 12/1996 |
| JP | 6177092 | 6/1994 |
| JP | 7029879 | 1/1995 |
| WO | 9615545 | 5/1996 |

OTHER PUBLICATIONS

Aydil, et al., "Multiple Steady States in a Radio Frequency Chlorine Glow Discharge," *J. Appl. Phys.*, vol. 69, No. 1, Jan. 1, 1991, pp. 109–114.

Hillenius, S.J., et al., "A Symmetric Submicron CMOS Technology," *IEEE*, pp. 252–255, 1986.

PCT Search Report dated Oct. 28, 1999.

PCT Notification of International Search Report dated Feb. 4, 1999.

U.S. patent application entitled, "Method for Improved Cleaning of Substrate Processing System"; filed Jul. 11, 1997; Ser. No. 08/893,922; Inventors: Kao, et al.

(Continued)

*Primary Examiner*—George A. Goudreau
(74) *Attorney, Agent, or Firm*—Joseph Bach; Ashok Janah

(57) ABSTRACT

A substrate processing method comprises providing a substrate 105 comprising etch resistant material 210 in a process zone 155, such as an energized gas zone in a process chamber 110. The etch resistant material 210 may comprise a resist material 230 over mask material 240. The process may further comprise removing the etch resistant material 210, such as the resist material 230, in the process zone 155 before etching underlying layers.

54 Claims, 6 Drawing Sheets

U.S. PATENT DOCUMENTS

| | | | |
|---|---|---|---|
| 4,876,212 A | 10/1989 | Koury | 438/34 |
| 4,975,144 A | 12/1990 | Yamazaki et al. | 156/643 |
| 4,992,136 A | 2/1991 | Tachi et al. | 156/643 |
| 4,994,410 A | 2/1991 | Sun et al. | 437/192 |
| 5,002,632 A | 3/1991 | Loewenstein et al. | 156/643 |
| 5,013,398 A | 5/1991 | Long et al. | 156/643 |
| 5,035,768 A | 7/1991 | Mu et al. | 156/626 |
| 5,084,126 A | 1/1992 | McKee | 156/345 |
| 5,094,712 A | 3/1992 | Becker et al. | 156/643 |
| 5,110,408 A | 5/1992 | Fujii et al. | 156/643 |
| 5,110,411 A | 5/1992 | Long | 156/656 |
| 5,118,387 A | 6/1992 | Kadomura | 156/657 |
| 5,158,644 A | 10/1992 | Cheung et al. | 156/643 |
| 5,160,407 A | 11/1992 | Latchford et al. | 156/656 |
| 5,164,330 A | 11/1992 | Davis et al. | 437/192 |
| 5,176,792 A | 1/1993 | Fullowan et al. | 156/652 |
| 5,188,980 A | 2/1993 | Lai | 437/193 |
| 5,192,702 A | 3/1993 | Tseng | 437/47 |
| 5,256,245 A | 10/1993 | Keller et al. | 156/643 |
| 5,281,302 A | 1/1994 | Gabric et al. | 156/643 |
| 5,282,899 A | 2/1994 | Balmashnov et al. | 118/723 R |
| 5,312,519 A | 5/1994 | Sakai et al. | 134/1 |
| 5,318,668 A | 6/1994 | Tamaki et al. | 156/662 |
| 5,338,398 A | 8/1994 | Szwejkowski et al. | 156/655 |
| 5,346,586 A | 9/1994 | Keller | |
| 5,354,417 A | 10/1994 | Cheung et al. | 156/643 |
| 5,356,478 A | 10/1994 | Chen et al. | 134/1 |
| 5,358,601 A | 10/1994 | Cathey | 156/656 |
| 5,378,311 A | 1/1995 | Nagayama et al. | 156/643 |
| 5,382,316 A | 1/1995 | Hills et al. | 156/643 |
| 5,413,954 A | 5/1995 | Aydil et al. | 437/81 |
| 5,431,772 A | 7/1995 | Babie et al. | 156/643.1 |
| 5,443,686 A | 8/1995 | Jones et al. | 216/37 |
| 5,449,411 A | 9/1995 | Fukuda et al. | 118/723 MP |
| 5,514,622 A | 5/1996 | Bornstein et al. | 437/189 |
| 5,521,119 A | 5/1996 | Chen et al. | 437/187 |
| 5,529,197 A | 6/1996 | Grewal | 216/68 |
| 5,620,615 A | 4/1997 | Keller | 438/720 |
| 5,626,775 A | 5/1997 | Roberts et al. | 216/67 |
| 5,644,153 A | 7/1997 | Keller | 257/324 |
| 5,700,739 A | 12/1997 | Chiang et al. | |
| 5,753,533 A | 5/1998 | Saito | 437/192 |
| 5,756,400 A | 5/1998 | Ye et al. | 438/710 |
| 5,767,021 A | 6/1998 | Imai et al. | 438/719 |
| 5,776,832 A | 7/1998 | Hsieh et al. | |
| 5,788,799 A | 8/1998 | Steger et al. | 156/345 |
| 5,843,239 A | 12/1998 | Shrotriya | 134/1.1 |
| 5,866,483 A | 2/1999 | Shiau et al. | 438/720 |
| 5,869,401 A | 2/1999 | Brunemeier et al. | 438/710 |
| 5,874,363 A | 2/1999 | Hoh et al. | 438/721 |
| 5,879,575 A | 3/1999 | Tepman et al. | 216/68 |
| 5,950,106 A * | 9/1999 | May et al. | 438/669 |
| 6,037,266 A | 3/2000 | Tao et al. | |
| 6,136,679 A * | 10/2000 | Yu et al. | 438/592 |
| 6,174,818 B1 * | 1/2001 | Tao et al. | 438/733 |
| 6,283,131 B1 * | 9/2001 | Chen et al. | 134/1.2 |

OTHER PUBLICATIONS

U.S. patent application entitled, "Apparatus for Improved Remote Microwave Plasma source for Use with Substrate Processing Systems"; filed Apr. 23, 1997; Ser. No. 08/839,111; Inventors: Kao, et al.

U.S. patent application entitled, "Method and Apparatus for Determining the Endpoint in a Plasma Cleaning Process"; filed Jul. 2, 1997; Ser. No. 08/887,165; Inventors: Subrahmanyam, et al.

U.S. patent application entitled, "Apparatus and Method for Efficient and Compact Remote Microwave Plasma Generation"; filed Apr. 22, 1997; Ser. No. 08/839,007; Inventor:Bhatnager.

U.S. patent application entitled, "Method and Apparatus for Pre–stabilized Plasma Generation for Microwave Clean Applications"; filed Nov. 13, 1996; Ser. No. 08/746,658; Inventors: Fong, et al.

U.S. patent application entitled, "Inductively Coupled HDP–CVD Reactor"; filed May 29, 1997; Ser. No. 08/865,018; Inventors: Redeker, et al.

U.S. patent application entitled, "Symmetric Tunable Inductively Coupled HDP–CVD Reactor"; filed Jul. 15, 1996; Ser. No. 08/679,927; Inventors: Redeker, et al.

U.S. patent application entitled, "Apparatus and Methods for Upgraded Substrate Processing System with Microwave Plasma Source"; filed Mar. 5, 1997; Ser. No. 08/811,627; Inventors: Tanaka, et al.

U.S. patent application entitled, "Microwave Apparatus for In–situ Vacuum Line Cleaning for Substrate Processing Equipment"; filed Oct. 30, 1996; Ser. No. 08/741,241; Inventors: Pang, et al.

* cited by examiner

ETCHING A SUBSTRATE IN A PROCESS ZONE

BACKGROUND

The invention relates to etching a substrate in a process zone.

In the manufacture of integrated circuits, active and passive devices are formed on a substrate, such as a semiconductor wafer, by alternately depositing and etching layers of dielectric, semiconducting, and conducting materials, such as silicon dioxide, polysilicon, and metal-containing materials. These layers may be etched to form a pattern of etched features in a predefined pattern of gates, vias, contact holes, trenches, and/or metal interconnect lines. Etching is typically performed using an energized etchant gas, such as a halogen-containing gas, as for example described in *Silicon Processing for the VLSI Era*, Vol. 1, Chapter 16, by Wolf and Tauber, Lattice Press, 1986, which is incorporated herein by reference.

The predefined pattern may be formed by providing photoresist over an underlying material to be etched. The photoresist may be patterned by lithography to expose portions of the underlying material. However, when photoresist is used it often is difficult to maintain the critical dimensions of the etched features. It is also difficult to obtain good etching selectivity for etching underlying material relative to the photoresist, especially when the underlying material is an oxide. In addition, while etching the underlying material, process conditions are generally selected to preserve the photoresist to prevent premature removal of the photoresist and also to reduce deposition of process residues on chamber or substrate surfaces. Furthermore, residual photoresist portions that are not etched by the etchant gases and which remain on the substrate after the etching process may need to be removed in a post processing step. Conventional photoresist removal processes, also known as stripping or ashing, are sometimes ineffective in removing all the resist from the substrate without overexposing a processed substrate to the energized stripping gas. In addition, resist removal processes compromise process throughput by adding a process step and a separate process chamber.

The process chambers used in processing a substrate are periodically cleaned to remove process residue deposits and contaminants that are formed on the surfaces in the chamber, otherwise these deposits may flake off and contaminate the substrate. In etching processes, after etching every 100 to 300 wafers, the chamber is often opened to the atmosphere and cleaned in a "wet-cleaning" process, in which an operator uses an acid or solvent to scrub off or dissolve accumulated etch residue on the chamber surfaces. After cleaning, the chamber is pumped down in a vacuum for 2 to 3 hours to outgas volatile species, and a series of etching runs are performed on dummy wafers until the chamber provides consistent etching properties. However, the downtime of the etching chamber during the cleaning process can substantially increase the cost per substrate. Also, because the wet cleaning process is manually performed, the cleanliness of the chamber surfaces often vary from one cleaning session to another.

Therefore, it is desirable to be able to etch a substrate with improved critical dimension control and etching selectivity. It is further desirable to process the substrate with increased throughput. It is still further desirable to process a substrate in a substantially clean process chamber to reduce the possibility of contaminating the substrate. It is still further desirable to remove sufficient amounts of etch resistant material from the substrate without undesirably etching the substrate with the energized gas.

SUMMARY

The present invention satisfies these needs. In one aspect of the invention, a substrate processing method comprises providing a substrate in a process zone, the substrate comprising etch resistant material over an underlying material, removing the etch resistant material in the process zone, and after the etch resistant material is removed, providing an energized process gas in the process zone to etch the underlying material.

In another aspect of the invention, a substrate processing method comprises providing a substrate in a process zone, the substrate comprising a first and a second etch resistant material, providing an energized process gas in the process zone to form apertures in the first etch resistant material, and removing the second etch resistant material in the process zone.

In another aspect of the invention, a substrate processing method comprises providing a substrate in a process zone, the substrate comprising etch resistant material, and removing the etch resistant material while detecting radiation emanating from the process zone.

In another aspect of the invention, a substrate processing method comprises providing a substrate in a process chamber, providing an energized process gas in the chamber to process the substrate, thereby depositing process residue on surfaces of the process chamber, providing an energized process gas in the chamber to simultaneously remove a material from the substrate and at least partially remove the process residue from the surfaces of the process chamber, and providing an energized process gas in the chamber to further process the substrate.

In another aspect of the invention, a substrate processing method comprises providing a first substrate in a process chamber, providing an energized process gas to etch the first substrate, thereby depositing first residue on the surfaces of the process chamber, providing a second substrate in the process chamber, and providing an energized process gas to process the second substrate and simultaneously remove the first residue from the surfaces of the process chamber.

In another aspect of the invention, a substrate processing method comprises providing a first substrate in a process chamber, providing an energized process gas to etch the first substrate, thereby depositing first residue on the surfaces of the process chamber, providing a second substrate in the process chamber, and providing an energized process gas to at least partially remove the first residue from the surfaces of the process chamber, and removing the second substrate from the chamber.

In another aspect of the invention, a substrate processing method comprises providing a substrate in a process chamber, providing a first energized process gas to etch a material on the substrate, thereby depositing residue on the surfaces of the process chamber, providing a second energized process gas to remove substantially all of the residue deposited from the surfaces of the process chamber, and removing the second substrate from the chamber.

In another aspect of the invention, a substrate processing method comprises providing a substrate in a process zone, the substrate comprising resist material over mask material, providing an energized process gas in the process zone to form apertures in the mask material, providing an energized process gas in the process zone to remove the resist material, and providing an energized process gas in the process zone to etch a layer under the mask material.

DRAWINGS

These features, aspects, and advantages of the present invention will become better understood with regard to the following description, appended claims, and accompanying drawings which illustrate exemplary features of the invention. However, it is to be understood that each of the features can be used in the invention in general, not merely in the context of the particular drawings, and the invention includes any combination of these features, where:

DESCRIPTION

The present invention relates to processing a substrate in an apparatus, for example to fabricate integrated circuits on the substrate and is particularly useful for processing layers, such as etch resistant, silicon-containing, metal-containing, dielectric, and/or conductor layers on the substrate. Although the process is illustrated in the context of etching one or more of the layers on the substrate, the present invention can be used in other processes such as chemical vapor deposition (CVD), physical vapor deposition (PVD), evaporation, post etch treatment, and other substrate fabrication processes and should not be limited to the examples provided herein.

Figure 1:
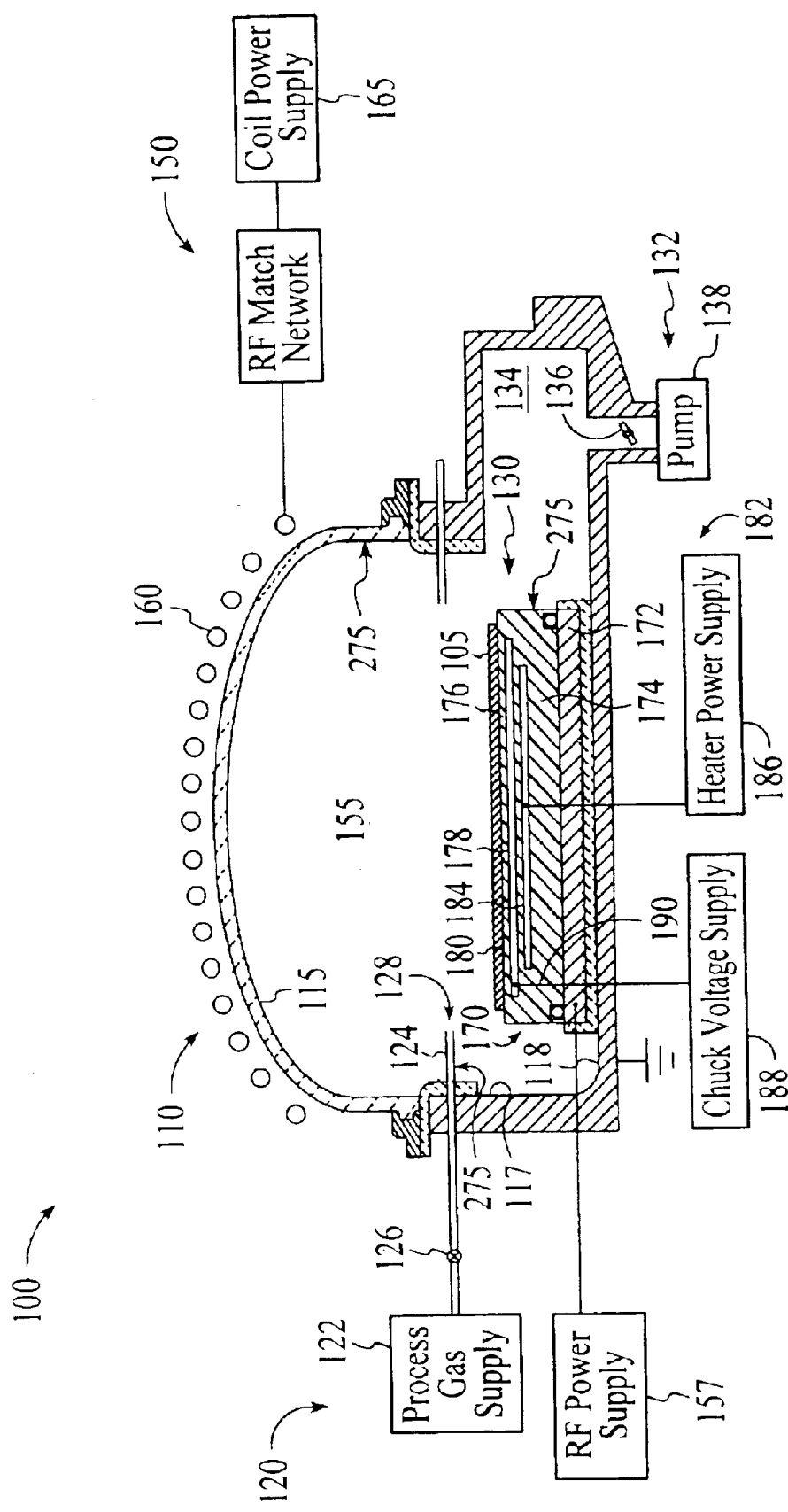
FIG. 1 is a schematic sectional side view of a process chamber with a process zone adapted to process a substrate according to the present invention.

An apparatus 100 suitable for processing a substrate 105 according to the principles of the present invention comprises a process chamber 110, such as a "DPS" chamber, schematically illustrated in FIG. 1, and commercially available from Applied Materials Inc., Santa Clara, Calif. The particular embodiment of the apparatus 100 shown herein is suitable for processing substrates 105, such as semiconductor wafers, and may be adapted by those of ordinary skill to process other substrates 105, such as flat panel displays, polymer panels, or other electrical circuit receiving structures. The apparatus 100 is provided only to illustrate the invention, and should not be used to limit the scope of the invention or its equivalents to the exemplary embodiments provided herein. The apparatus 100 may be attached to a mainframe unit that contains and provides electrical, plumbing, and other support functions for the apparatus 100. Exemplary mainframe units compatible with the illustrative embodiment of the apparatus 100 are currently commercially available as the Precision 5000™ systems from Applied Materials, Inc., of Santa Clara, Calif. The multichamber system has the capability to transfer a wafer between its chambers without breaking the vacuum and without exposing the wafer to moisture or other contaminants outside the multichamber system. An advantage of the multichamber system is that different chambers in the multichamber system may be used for different purposes in the entire process. For example, one chamber may be used for etching a substrate 105, another for the deposition of a metal film, another may be used for rapid thermal processing, and yet another may be used for depositing an anti-reflective layer. The process may proceed uninterrupted within the multichamber system, thereby preventing contamination of substrates 105 that may otherwise occur when transferring substrates 105 between various separate individual chambers (not in a multichamber system) for different parts of a process.

Generally, the apparatus 100 comprises a chamber 110 comprising walls typically fabricated from metal or ceramic materials. Metals commonly used to fabricate the chamber 110 include aluminum, anodized aluminum, "HAYNES 242," "AI-6061," "SS 304," "SS 316," and INCONEL, of which anodized aluminum is preferred. In the embodiment shown, the chamber 110 comprises a wall which may comprise a ceiling 115, sidewalls 117, and a bottom wall 118. The ceiling 115 may comprise a substantially arcuate portion, or in other versions, the ceiling 115 may comprise a dome, substantially flat, or multi-radius shaped portion. The chamber 110 typically comprises a volume of at least about 5,000 cm$^3$, and more typically from about 10,000 to about 50,000 cm$^3$. In operation, process gas is introduced into the chamber 110 through a gas supply 120 that includes a process gas source 122, conduits 124 having flow control valves 126, and gas outlets 128 around a periphery of the substrate 105 which may be held on a support 130. As an alternative to the configuration shown in FIG. 1, the process gas may be introduced through a showerhead (not shown) mounted on or near the ceiling 115 of the chamber. Spent process gas and etchant byproducts are exhausted from the chamber 110 through an exhaust system 132 which includes a pumping channel 134 that receives spent process gas, a throttle valve 136 to control the pressure of process gas in the chamber 110, and one or more exhaust pumps 138. The exhaust system 132 may also contain a system for abating undesirable gases from the exhaust.

The process gas is energized to process the substrate 105 by a gas energizer 150 that couples energy to the process gas in the process zone 155 of the chamber 110 (as shown) or in a remote zone upstream from the chamber 110 (not shown). In one version, the gas energizer 150 comprises an antenna 160 comprising one or more inductor coils which may have a circular symmetry about the center of the chamber 110. Typically, the inductor coils 160 comprises solenoids having from about 1 to about 20 turns. A suitable arrangement of solenoids is selected to provide a strong inductive flux linkage and coupling to the process gas. When the antenna 160 is positioned near the ceiling 115 of the chamber 110, the adjacent portion of the ceiling may be made from a dielectric material, such as silicon dioxide, which is transparent to RF or electromagnetic fields. An antenna power supply 165 provides, for example, RF power to the antenna 160 at a frequency of typically about 50 KHz to about 60 MHz, and more typically about 13.56 MHz; and at a power level of from about 100 to about 5000 Watts. An RF match network may also be provided.

In one version, the gas energizer 150 may also or alternatively comprise process electrodes that may be powered by a power supply 157 to energize or further energize the process gas. Typically, the process electrodes include one electrode in a wall, such as a sidewall 117 or ceiling 115 of the chamber 110 that may be capacitively coupled to another electrode, such as an electrode in the support 130 below the substrate 105. The electrode may comprise a dielectric ceiling 115 that serves as an induction field transmitting window that provides a low impedance to an RF induction field transmitted by the antenna 160 above the ceiling 115. Suitable dielectric materials that can be employed include materials such as aluminum oxide or silicon dioxide. Generally, the electrodes may be electrically biased relative to one another by an electrode voltage supply (not shown) that includes an AC voltage supply for providing an RF bias voltage. The RF bias voltage may comprise frequencies of about 50 kHz to about 60 MHz, and is preferably about 13.56 MHz, and the power level of the RF bias current is typically from about 50 to about 3000 watts. Alternatively or additionally, the gas energizer 150 may comprise a microwave gas activator (not shown) that transmits microwaves to the gas to energize the gas.

The support 130 may comprise an electrostatic chuck 170 which comprises a base 172 for supporting a dielectric 174 which comprises a portion 176 which at least partially covers a chucking electrode 178 and which may include a substrate receiving surface 180. The electrode 178 may also serve as one of the process electrodes discussed above (as shown in FIG. 5). Alternatively, the base 172 may serve as a process electrode (as shown in FIG. 1). The base 172 may have channels (not shown) through which heat transfer fluid is circulated to heat or cool the substrate 105. The base 172 may be generally shaped and sized to match the shape and size of the substrate 105 to maximize heat transfer to the substrate. For example, for a substrate 105 having a circular or disk shape, the base 172 may be of generally right cylindrical shape. In one version, the base 172 comprises an electrically conducting material, such as aluminum, and is surrounded by an insulating shield or jacket made of, for example, an insulating polymeric or ceramic material, such as quartz. In one version, the base 172 may be electrically biased by a voltage supply.

The dielectric 174 of the support 130 or electrostatic chuck 170 isolates, or partially isolates, the electrode 178 from the substrate 105 and the energized gas in the chamber 120. In an alternative configuration, the dielectric 174 may cover the base 172 which serves as the electrode. As shown, the dielectric 174 comprises a monolith in which the electrode 178 is embedded. The dielectric 174 may be made from a dielectric material that is resistant to erosion by the gas or plasma and capable of withstanding high temperatures. Suitable dielectric materials include, for example, ceramic materials, such as $Al_2O_3$, AlN, BN, Si, SiC, $Si_3N_4$, $TiO_2$, $ZrO_2$, and mixtures and compounds thereof, and polymeric materials such as polyimide, polyamide, polyetherimide, polyketone, polyetherketone, polyacrylate, fluoroethylene, or mixtures thereof or the like. The thickness of the portion of dielectric material 176 overlying the electrode 178 is typically from about 100 micrometers to about 1000 micrometers.

The support 130 or electrostatic chuck 170 may also comprise temperature controlling devices. For example, the dielectric 174 may comprise one or more conduits (not shown) extending therethrough, such as for example, a gas conduit provided to supply heat transfer gas from a heat transfer gas supply (not shown) to an interface between the surface 180 of the dielectric 174 and the substrate 105. The heat transfer gas, typically helium, promotes heat transfer between the substrate 105 and the support 130 or electrostatic chuck 170. Other conduits may, for example, allow lift pins (not shown) to extend through the dielectric 174 for loading or unloading of the substrate 105 by a lift mechanism. The support 130 may also comprise a heating system 182. In one version the heating system may comprise a heating element 184, such as a resistively heated plate, wire, mesh or coil, through which a current may pass to cause the element to increase in temperature. A heater power supply 186 may be provided to provide a heating voltage to the heating element 184 under the control of a system controller.

The electrode 178 may be capable of generating an electrostatic charge for electrostatically holding the substrate 105 to the support 130 or electrostatic chuck 170. A DC voltage supply 188 provides the chucking voltage to the electrode 178 through an electrical connector 190 such as a banana jack inserted through the dielectric 174. The DC chuck power supply 188 typically provides a DC chuck voltage of 250 to 2000 volts to the electrode 178. The voltage supply 188 can also include a system controller for controlling the operation of the electrode 178 for chucking or dechucking the substrate 105.

In another chamber embodiment (not shown), the energized gas, such as a capacitively generated plasma, may be substantially confined to the process zone 155 immediately above the surface of the substrate 105 by a magnetic field (not shown) that is substantially perpendicular to the plane of the substrate. The magnetic field is generated by permanent magnets or electromagnets (neither shown) adjacent to the chamber 110, as for example, described in U.S. Pat. No. 4,842,683, issued Jun. 27, 1989, which is incorporated herein by reference.

Processing a Substrate

The apparatus 100 illustrated herein can be used to process material on a substrate 105, for example to etch material from the substrate 105; remove contaminant deposits or residues deposited on surfaces in the chamber 110, such as on the surfaces of walls of the chamber 110 and the surfaces of components in the chamber 110; perform post processing treatment of a substrate 110, or the like. For example, in one version, the apparatus 100 may be used to etch a substrate 105, such as a substrate 105 comprising one or more layers of material. Such layers are often superimposed on one another and may comprise dielectric layers comprising, for example, silicon dioxide, undoped silicate glass, phosphosilicate glass (PSG), borophosphosilicate glass (BPSG), $Si_3N_4$, or TEOS deposited glass; semiconducting layers comprising, for example, silicon-containing layers such as polysilicon or a silicon compound; and conductive layers such as metal-containing layers comprising, for example, aluminum, copper, or metal silicide such as tungsten silicide and cobalt silicide. Suitable etchant gases for etching layers on the substrate 105, include for example, HCl, $BCl_3$, HBr, $Br_2$, $Cl_2$, $CCl_4$, $SiCl_4$, $SF_6$, F, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The etchant gas is selected to provide high etch rates, and highly selective etching of the particular layers or materials that are being etched. When multiple layers are sequentially etched, first, second, third, etc., etchant gas compositions may be sequentially introduced into the chamber to etch each particular layer, To etch one or more of the layers on the substrate 105 in the process chamber 110, process gas comprising etchant gas is introduced from the gas supply 120 into the process zone 155 and energized by the gas energizer 150 to form an energized gas. The gas may be energized by inductively and/or capacitively coupling energy into the process zone 155 of the chamber 110, or by applying microwaves thereto or to an etchant gas in a remote zone of a remote chamber (not shown) that is at a location remote from the process zone 155. By "energized process gas" it is meant that the process gas is activated or energized so that one or more dissociated species, non-dissociated species, ionic species, and neutral species are excited to higher energy states in which they are more chemically reactive. In the version shown in FIG. 1, the process gas is energized by applying an RF source current to the inductor antenna 160 adjacent to the chamber 110 and optionally by also applying an RF bias voltage to process electrodes. The energized etchant gas etches one or more layers on the substrate 105 to form volatile gaseous species that are exhausted from the chamber 110 by exhaust system 132.

Figure 2A:
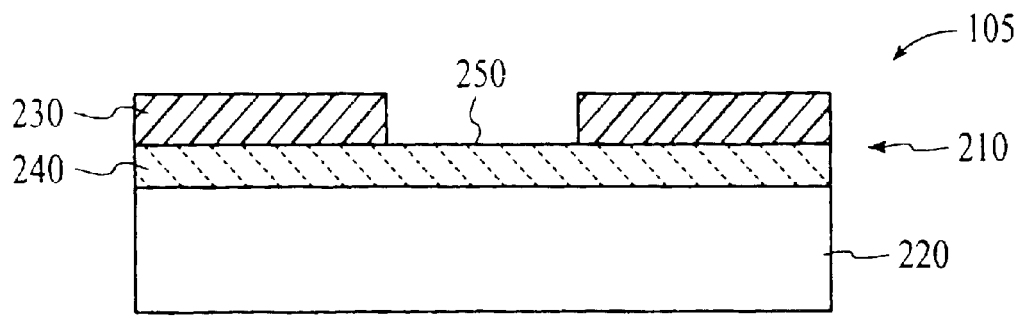
FIGS. 2a through 2d are schematic sectional side views of a substrate that is processed according to one version of the present invention.

An example of a substrate 105 which may be etched in accordance with the present invention is shown in FIG. 2a. In the version of FIG. 2a, the substrate 105 comprises etch resistant material 210 overlying a workpiece 220, which may comprise one or more layers of material. The etch resistant material 210 is resistant to etch by process gas which is introduced into a process zone 155 under process conditions selected to etch into and/or through an underlying material, such as the workpiece 220 which may be a wafer or layers on a wafer as will be discussed. The etch resistant material 210 may be patterned to expose portions of the underlying material for etching. For example, the etch resistant material 210 may comprise resist material 230, such as polymeric or organic resist. The resist material 230 may be patterned by conventional photolithographic methods or may be patterned by etching the resist material 230 in a process chamber 110. In one version, the etch resistant material 210 comprises an organic, polymeric photoresist that is transparent to ultraviolet light frequencies and does not block incident light beams having wavelengths in the ultraviolet range. Alternatively or additionally, the etch resistant material 210 may comprise mask material 240 comprising, for example, a dielectric material or hard mask, such as silicon oxide, TEOS, silicon nitride, or equivalents. In the version of FIG. 2a, the substrate 105 comprises an etch resistant material 210 comprising a patterned resist material 230 over a mask material 240.

Figure 2B:
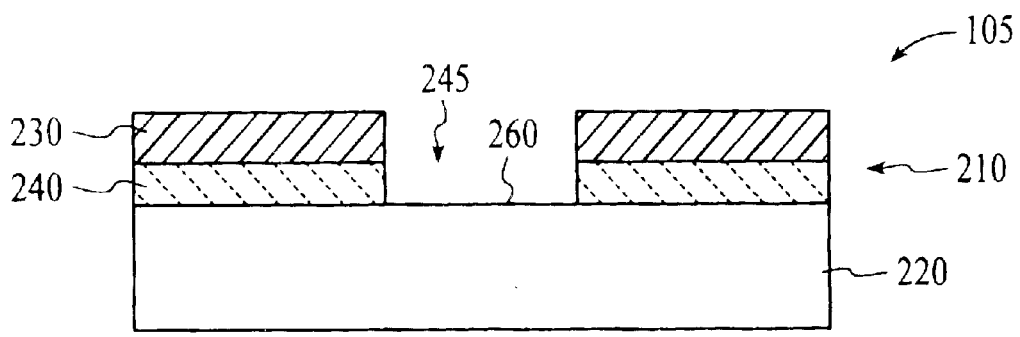

The mask material 240 may be patterned by providing the substrate in a process zone 155 and introducing process gas into the process zone 155 to etch into the exposed portion 250 of the mask material 240 to form apertures 245 therein in accordance with the pattern of the resist material 230. For example, the process gas may comprise a mask material etching gas comprising one or more gases selected to etch into the mask material 240. In one version, a process gas comprising a mask material etching gas is introduced to etch into and through the mask material 240 to open the mask and form the apertures 245, as shown in FIG. 2b, to expose a portion 260 of the workpiece 220. In one version, the mask material etching gas comprises a halogen containing gas, such as a fluorine containing gas. For example, the mask etching gas may comprise one or more of HCl, BCl$_3$, HBr, Br$_2$, Cl$_2$, CCl$_4$, SiCl$_4$, SF$_6$, F$_2$, NF$_3$, HF, CF$_3$, CF$_4$, CH$_3$F, CHF$_3$, C$_2$H$_2$F$_2$, C$_2$H$_4$F$_6$, C$_2$F$_6$, C$_3$F$_8$, C$_4$F$_8$, C$_2$HF$_5$, C$_4$F$_{10}$, CF$_2$Cl$_2$, CFCl$_3$ or equivalents. In one particular version, the mask material comprises one or more of silicon oxide, TEOS, and silicon nitride and the mask material etching gas comprises one or more of CF$_4$, C$_2$F$_6$, SF$_6$, and NF$_3$. The process gas may further comprise a carrier or inert gas, such as one or more of Ar and He to aid in controlling etch sputtering and/or dilution.

The resist material 230 may be removed from the substrate by introducing an energized stripping gas into the process zone 155. The stripping gas may comprise one or more of O$_2$, N$_2$, H$_2$O, NH$_3$, CF$_4$, C$_2$F$_6$, CHF$_3$, C$_3$H$_2$F$_6$, C$_2$H$_4$F$_2$, or CH$_3$F. A suitable stripping gas for stripping the polymeric resist comprises (i) oxygen, and (ii) an oxygen activating gas or vapor, such as nitrogen gas, water vapor, or fluorocarbon gas, the fluorocarbon gases including any of those listed above. The oxygen activating gas increases the concentration of oxygen radicals in the stripping gas. In one version, the stripping gas comprises oxygen and nitrogen in a volumetric flow ratio of about 1:2 to about 200:1, and more preferably from about 0.8:1 to about 12:1, and most preferably about 1:1. For a 5000 cm$^3$ process chamber 110, a suitable gas flow rate comprises about 100 sccm of O$_2$ and about 100 sccm of N$_2$. The substrate 105 may be exposed to the stripping gas for a period of time of from about 10 seconds to about 1000 seconds, and more preferably for about 60 seconds. A single stripping step may be performed or multiple stripping steps may be performed, as discussed in U.S. Pat. No. 5,545,289, which is incorporated herein by reference in its entirety.

Figure 2C:
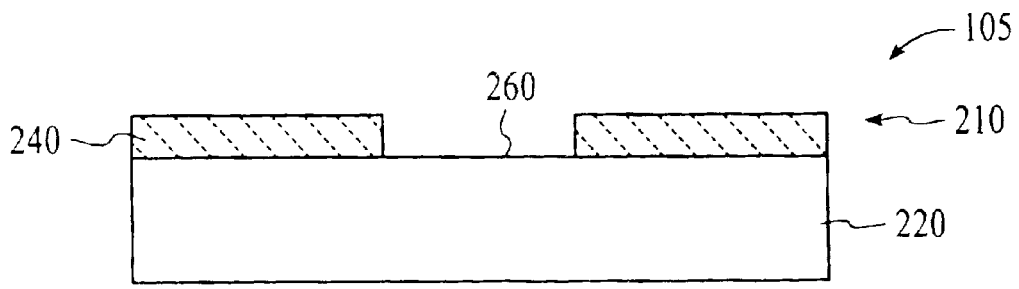
Figure 2D:
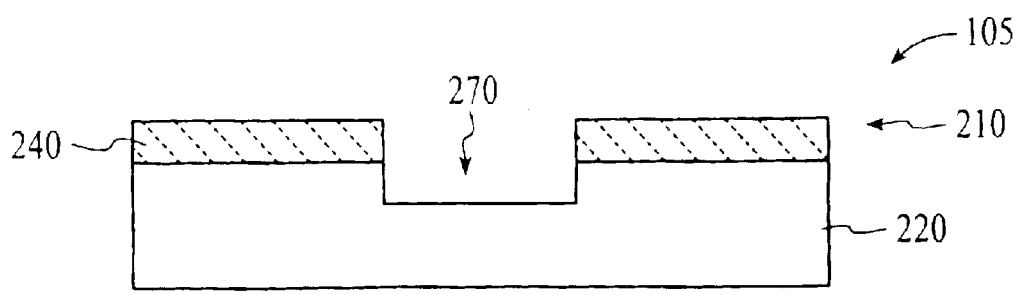

In one version of the invention, the resist material 230 may be removed from the substrate 105 before the workpiece 220 is etched. For example, following forming the apertures 245 to pattern the mask material 240, the resist material 230 may be removed, as shown in FIG. 2c, leaving patterned mask material 240 over the workpiece 220. The resist material 230 may be removed by exposing the resist material 230 or remnant resist material to an energized stripping gas, for example. After removal of the resist material 230, the exposed portions 260 of the workpiece 220 may be etched by introducing etchant gas, for example halogen-containing gas, to form features 270, such as apertures that may be used to form, for example, gates, vias, contact holes, trenches, and/or metal interconnect lines, as shown in FIG. 2d.

Removing the resist material 230 before etching features 270 in the workpiece 220 has several advantages over post-etch removal of the resist material 230. For example, when the resist material 230 is removed and an underlying mask material 240 serves as the etch resistant material 210 for defining the pattern that will be etched into the workpiece 220, an improved etch of the workpiece 220 may be performed. The mask material 240 is often more resistant to the etchant gas introduced to etch the workpiece 220 than the resist material 230 and thereby provides better selectivity to etching the underlying material. This allows for improved critical dimension (CD) control. In addition, by eliminating the necessity to preserve the resist material 230, more aggressive workpiece etchant process conditions may be utilized, thereby allowing for an increased etch rate of the workpiece 220. Also, when resist material 230 is present during etching of a silicon-containing material in the workpiece 220, partial removal or sputtering of the resist material 230 and etchant byproducts from the etching of the workpiece 220 can create a sandwich type of residue that can deposit on the substrate 105 and/or on surfaces of the chamber 110. The sandwich type deposit, such as layered silicon oxide and polymer, are difficult to clean and potentially can flake-off and affect the quality of the processed substrate 105. By removing the resist material 230 before etching the workpiece 220, the formation of the sandwich type deposits during etching of the workpiece 220 can be substantially avoided.

In one version, the resist material 230 is removed from the substrate 105 and the workpiece 220 is etched in the same process zone 155. The resist material 230 may also be removed before the workpiece 220 is etched. Removing resist material 230 and etching the workpiece 220 in the same process zone improves process throughput. For example, by not transferring the substrate from an etching chamber to a resist removal chamber, throughput can be substantially increased. Additionally, eliminating the necessity of a resist removal chamber in a multichamber system can provide space for parallel processing of substrates, further increasing throughput. In another version, The mask material 240 is patterned and the resist material 230 is removed in the same process zone 155. This version also increases throughput and provides additional processing space in a multichamber system by avoiding the need to have a separate mask material 240 etching chamber and resist material 230 removal chamber.

In another version, apertures are formed in the mask material 240, the resist material 230 is removed, and the workpiece 220 is etched in the same process zone 155. This version further increases throughput by using a single chamber instead of three chambers and provides even more utilizable space in a multichamber system. In addition, performing all three of these steps in a single process zone 155 provides unexpected results. For example, among the unexpected advantages are improved chemistry compatibilities, synergistic chamber cleaning treatment, simplified post processing treatment, and enhanced etch performance.

By using a single process zone 155 to form apertures in the mask material 240, remove resist material 230, and etch the workpiece 220, the process conditions may be selected to result in simultaneous chamber cleaning and substrate processing. For example, when mask material 240, which may comprise silicon oxide, silicon nitride, or TEOS, is opened in a mask patterning process gas, polymeric residue may be formed on the substrate and on surfaces 275 in the chamber 110. These surfaces 275 include the surfaces of walls of the chamber 110 and the surfaces of components within or near the chamber 110. The process residue may be removed during the removal of the resist material 230. For example, the process gas comprising stripping gas may be introduced under process conditions selected to simultaneously remove the resist material 230 from the substrate 105 and remove the residue deposited on the chamber surfaces 275 during etching of the mask material 240. This provides a chamber 110 with surfaces 275 substantially devoid of residue when etching of the workpiece 220 is initiated. During etching of the workpiece 220, particularly during etching of silicon-containing layers or material in or on the workpiece 220, etchant residue may be deposited on the surfaces 275 in the chamber 110. The etchant residue may comprise, for example, silicon oxide. Thus, when the substrate 105 is removed from the chamber 110, and a second substrate 105 is provided in the process zone 155 and process gas comprising mask material etching gas is introduced to open the mask material 240 of the second substrate 105, the mask material etching gas may be introduced under process conditions selected to also remove residue on the chamber surfaces 275 that was generated during the etching of the workpiece 220 of the previously processed substrate 105. The residue then formed during etching of the mask material 240 is deposited directly on the chamber surfaces 275 rather than on top of previously formed etchant residue, and this residue is then removed as discussed above. This cyclical etching and cleaning process may continue throughout processing of a batch of substrates 105 with the mask material patterning step simultaneously cleaning etchant residue formed during processing of a previous substrate, the resist material removal step simultaneously removing residue formed during mask patterning of the present substrate. Thus, a consistently clean chamber is continuously present for the initiation of etching of each substrate 105 in the batch of substrates.

In one version, a two-step mask material etch may be performed. For example, a first step may comprise exposing mask material 240 to process gas comprising a composition that is substantially absent a polymer forming gas and the second step may comprise exposing the mask material 240 to process gas having a composition comprising a polymer forming gas. In one particular version, the first mask material etchant gas may comprise a fluorine-containing gas, for example, in one version, the first mask material etchant gas comprises one or more of $CF_4$, $C_2F_6$, $NF_3$, and $SF_6$, and the second mask material etchant gas may comprise one or more of $CHF_3$, $CH_2F_2$, and $CH_3F$, with or without one or more of $CF_4$, $C_2F_6$, $NF_3$, and $SF_6$. The first or second mask material etchant gases may also comprise an inert or carrier gas, such as Ar, He, or N to aid in controlling sputtering and/or dilution. In this version, the etchant residue formed during processing of a previous substrate may be cleaned from the chamber surfaces 275 before polymeric residues are formed and deposited thereon. This can result in easier removal of the etchant deposits. Sandwich deposits comprising a layer of silicon-containing etchant residue and a layer of polymer can be difficult to clean and can result in flaking during substrate processing that can affect the quality of the processing. By first introducing a non-polymerizing mask etching gas, the mask material 240 may be etched and the etchant residue may be cleaned from the chamber surfaces 275 before the polymeric residue 13 formed and deposited on the chamber surfaces 275. It is advantageous to use the mask material etchant gas comprising polymer forming gas because it aids in etch process performance.

Figure 3A:
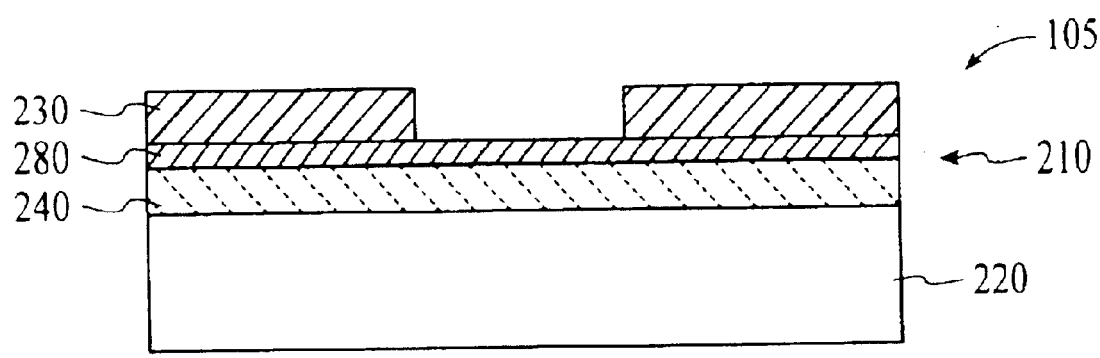
FIGS. 3a through 3c are schematic sectional side views of a substrate that is processed according to another version of the present invention.
Figure 3B:
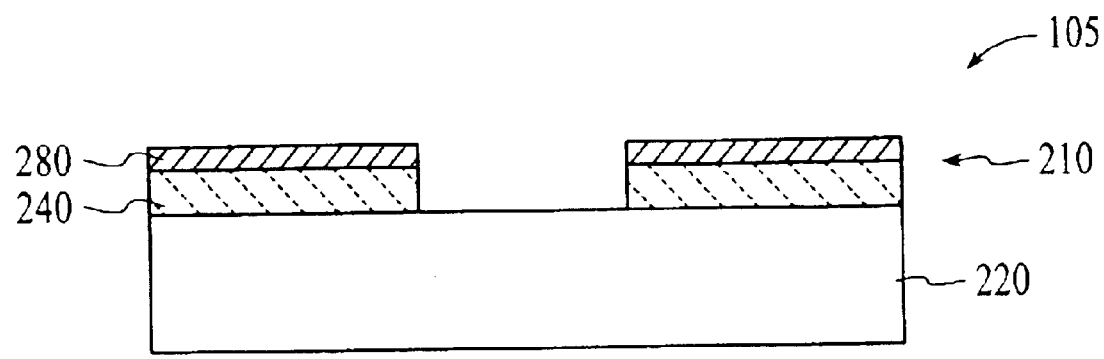
Figure 3C:
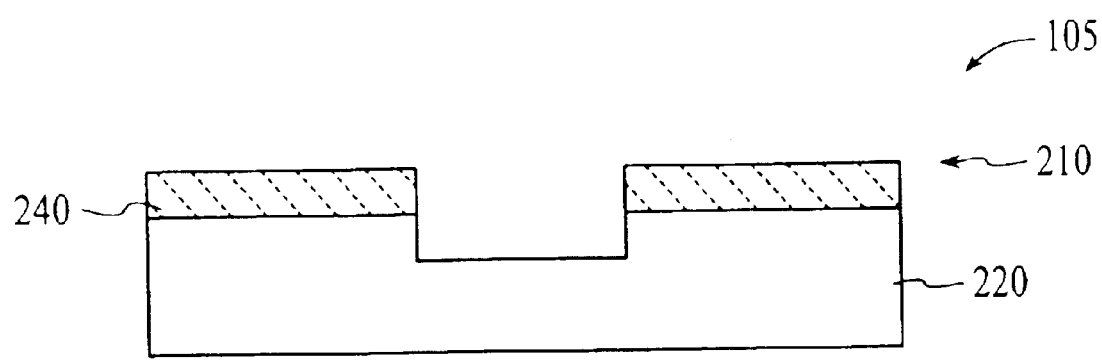

Another advantage of performing the mask material 240 patterning step, the resist material 230 removal step, and the workpiece 220 etching step in the same process zone 155 is that post processing treatment of the substrate 105 may be simplified. For example, the etch resistant material 210 may, in one version, comprise an anti-reflective coating (ARC), material 280 between the resist material 230 and the mask material 240, as shown in FIG. 3a. Anti-reflective coating material, such as SiON, or SiN, assists in photolithographic processes. As shown in FIG. 3b, after the mask material 240 has been opened and the resist material 230 has been removed, a top layer of ARC material 280 remains on the substrate. Typically, the ARC material 280 is removed from the substrate in a separate post processing treatment step. However, in one version of the invention, the workpiece 220 may be etched and the ARC material 280 may be simultaneously removed by exposing the workpiece 220 and the ARC material 280 to process gas comprising etching gas under process conditions selected to etch into the workpiece 220 and remove the ARC material 280, as shown in FIG. 3c. In one version, the process gas comprises a fluorine-containing gas, such as $CF_4$, and a halogen-containing gas, such as $Cl_2$ and, optionally nitrogen or argon. The resulting processed substrate 105 does not need a separate ARC material removal step in another process chamber.

Figure 4A:
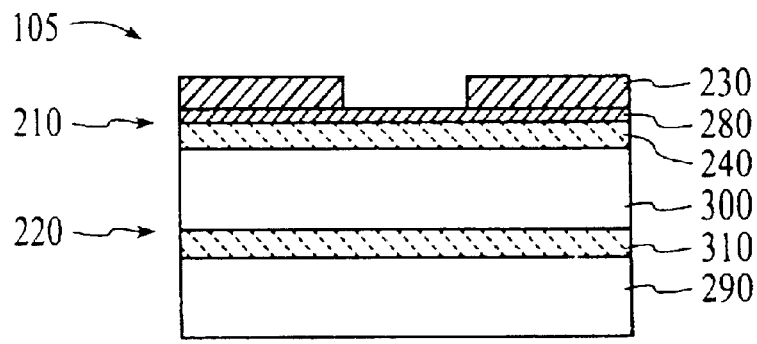
FIGS. 4a through 4e are schematic sectional side views of a substrate that is processed according to yet another version of the present invention.

One particular version of the invention is shown in FIGS. 4a–4e. This version is merely exemplary and is not intended to limit the invention. As shown in FIG. 4a, a substrate 105 that may be processed in accordance with the present invention may include etch resistant material 210 overlying a workpiece 220. The etch resistant material may comprise resist material 230, such as photoresist, and mask material 240, such as silicon oxide, TEOS, or silicon nitride, with anti-reflective material 280, such as TiN, silicon oxynitride, silicon nitride, or organic anti-reflective material, therebetween. The workpiece 220 may comprise a base 290, such as a wafer comprising silicon or a compound semiconductor, such as gallium arsenide, which may have doped regions. A semiconducting or conducting material 300, for example a silicon-containing layer such as doped or undoped polysilicon or a silicon compound such as metal silicide overlies the base 290. Between the semiconducting or conducting material 300, a gate oxide material 310 may be provided. The gate oxide material may comprise an oxide material, such as silicon oxide, having a thickness of from about 10 Å to about 300 Å. Other versions of substrates 105 may alternatively be processed. For example, one or more of the above described layers may be removed and/or a metal containing layer or a diffusion barrier layer, comprising for example one or more of Ti, TiN, Ta, TaN, W, and WN may be provided.

Figure 4B:
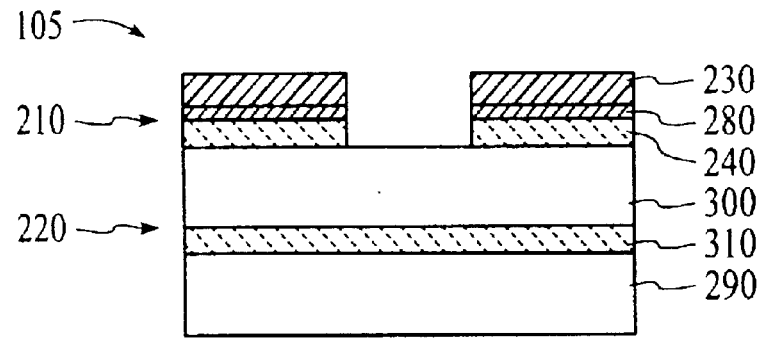
Figure 4C:
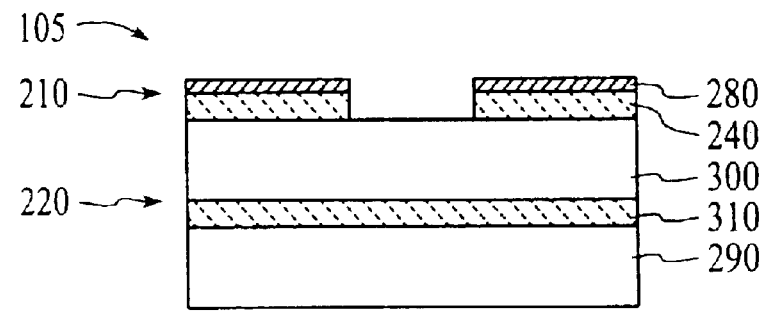

Table 1 summarizes an example of process conditions including process gas compositions which may be used to process the substrate 105 of FIG. 4a and clean the process chamber 110 in accordance with one version of the present invention. After providing the substrate 105 in the process zone 155, an anti-reflective coating etch step comprises providing energized process gas comprising reactive and non-reactive gas, such as $CF_4$ and Ar, respectively, in the process zone 155 to etch the anti-reflective coating 280, if present. In one version, the volumetric flow ratio of non-reactive to reactive gas is from about 0:1 to about 5:1, more preferably from about 1:1 to about 2:1, and most preferably about 1.5:1. The mask material 240 may be etched in two steps. A first mask material etch step comprises providing energized process gas comprising reactive and non-reactive gas, such as $CF_4$ and Ar, respectively, in the process zone 155 to etch the mask material 240 and to remove etchant residue that may have been formed during the processing of previous substrates. In one version, the volumetric flow ratio of non-reactive to reactive gas is from about 0:1 to about 5:1, more preferably from about 1:1 to about 2:1, and most preferably about 1.5:1. A second mask material etch step comprises providing energized process gas comprising reactive gas and non-reactive gas in the process zone 155 to further etch the mask material 240. In one version, the reactive gas comprises a polymer generating gas, such as $CHF_3$, $CH_2F_2$, or $CH_3F$. Optionally, an additional reactive gas, such as $CF_4$, may be provided. The volumetric flow ratio of non-reactive to reactive gas may be from about 0:1 to about 5:1, more preferably from about 1:1 to about 2:1, and most preferably about 1.5:1. FIG. 4b shows a substrate 105 with the mask material 240 etched to form a patterned mask layer. The next step comprises removing remnant resist material 230, and optionally removing polymeric residue on the chamber surfaces 275 formed during etching of the mask material 240, by providing an energized stripping gas, such as $O_2$ and $N_2$ in a volumetric flow ratio of oxygen to nitrogen of about 1:0 to about 1:5, more preferably from about 2:1 to about 1:2, and most preferably about 1:1, or other stripping gas as discussed above. The mask material 240 may then serve as etch resistant material 210 to form a pattern in the underlying material, as shown in FIG. 4c.

TABLE 1

| Material | Process Gas Flow Ratio | Source Power (Watts) | Bias Power (Watts) | Pressure (mTor) | Temperature (° C.) |
|---|---|---|---|---|---|
| Anti-reflective Coating Etch | 3/2 Ar/$CF_4$ | 600 | 150 | 4 | 50 |
| Mask Material First Etch | 3/2 Ar/$CF_4$ | 600 | 150 | 4 | 50 |
| Mask Material Second Etch | 6/1/3 Ar/$CF_4$/$CHF_3$ | 600 | 150 | 4 | 50 |
| Resist Stripping | 1/1 $O_2$/$N_2$ | 1000 | 100 | 150 | 50 |
| Metal Silicide Etch | 2/2/1 $CF_4$/$Cl_2$/$N_2$ | 400 | 75 | 4 | 50 |
| Polysilicon First Etch | 60/1 HBr/$O_2$ | 300 | 60 | 15 | 50 |
| Polysilicon Second Etch | 72.5/1 HBr/$O_2$ | 450 | 120 | 65 | 50 |

Figure 4D:
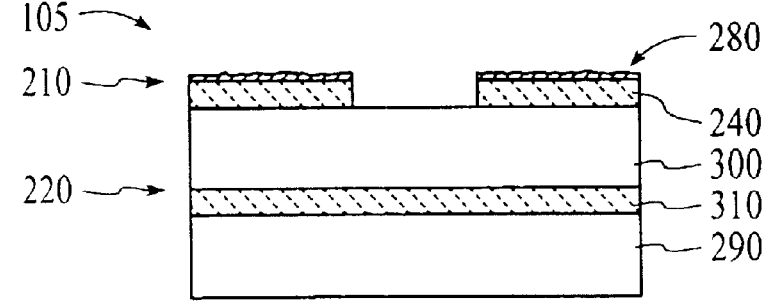
Figure 4E:
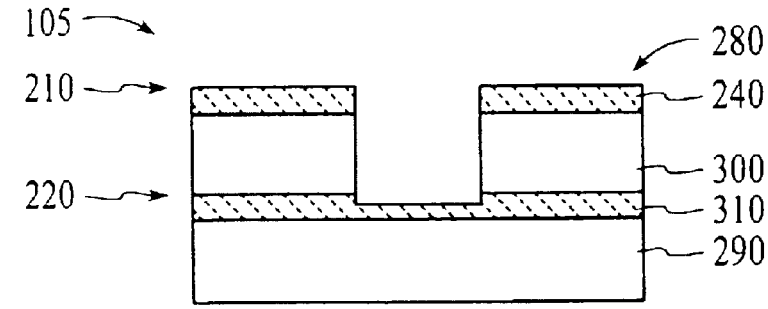

The workpiece 220 may then be etched in the process zone 155. The semiconducting or conducting material 300 may comprise a metal suicide layer and/or a polysilicon layer. A metal silicide layer, such as WSi, may be etched by providing an energized process gas comprising non-reactive gas and reactive gas in a volumetric flow ratio of from about 0:1 to about to about 4:1, more preferably from about 0:1 to about 1:1, and most preferably about 1:4. The reactive gas may comprise, for example, one or more of the earlier mentioned etchant gases, such as one or more of $CF_4$, $C_2F_6$, $NF_3$, $SF_6$, $Cl_2$, $Br_2$, HBR, and HCl. The non-reactive gas may comprise $N_2$, Ar, or the like. In one version, a polysilicon layer may be etched by providing an energized process gas comprising a halogen-containing gas, such as one or more of HBr, HCl, $Br_2$, $Cl_2$, $CF_4$, $NF_3$, and $SF_6$, and optionally an oxygen-containing gas, such as one or more of $O_2$, $O_3$, and He-$O_2$. In one version, the polysilicon layer may be etched in a two steps, such as shown in Table 1, to provide controlled etch feature shape, as desired. As shown in FIGS. 4d and 4e, as the semiconducting or conducting material 300 is being etched, the ARC material 280 may be removed.

Since the workpiece 220 is not susceptible to the energized stripping gas used to remove the resist material 230, process conditions can be selected to remove the resist material 230 at a high rate. For example, a bias power of from about 20 watts to about 500 watts, more preferably from about 100 watts to about 200 watts, and most preferably about 100 watts, can be applied during the resist material removal. The bias power has been shown to aid in sputtering the resist material 230 or other residue on the substrate 105. Additionally, the chamber pressure can be increased to at least about 4 mTorr, and more preferably at least about 100 mTorr, to help facilitate the resist removal by increasing oxygen concentration. To further increase the resist material removal rate, the substrate 105 can be heated, such as by shutting off the circulation of cooling fluid in the support 130, to a temperature of at least about 100 degrees C. The substrate 105 may then be cooled down to etch the workpiece 220.

Figure 5:
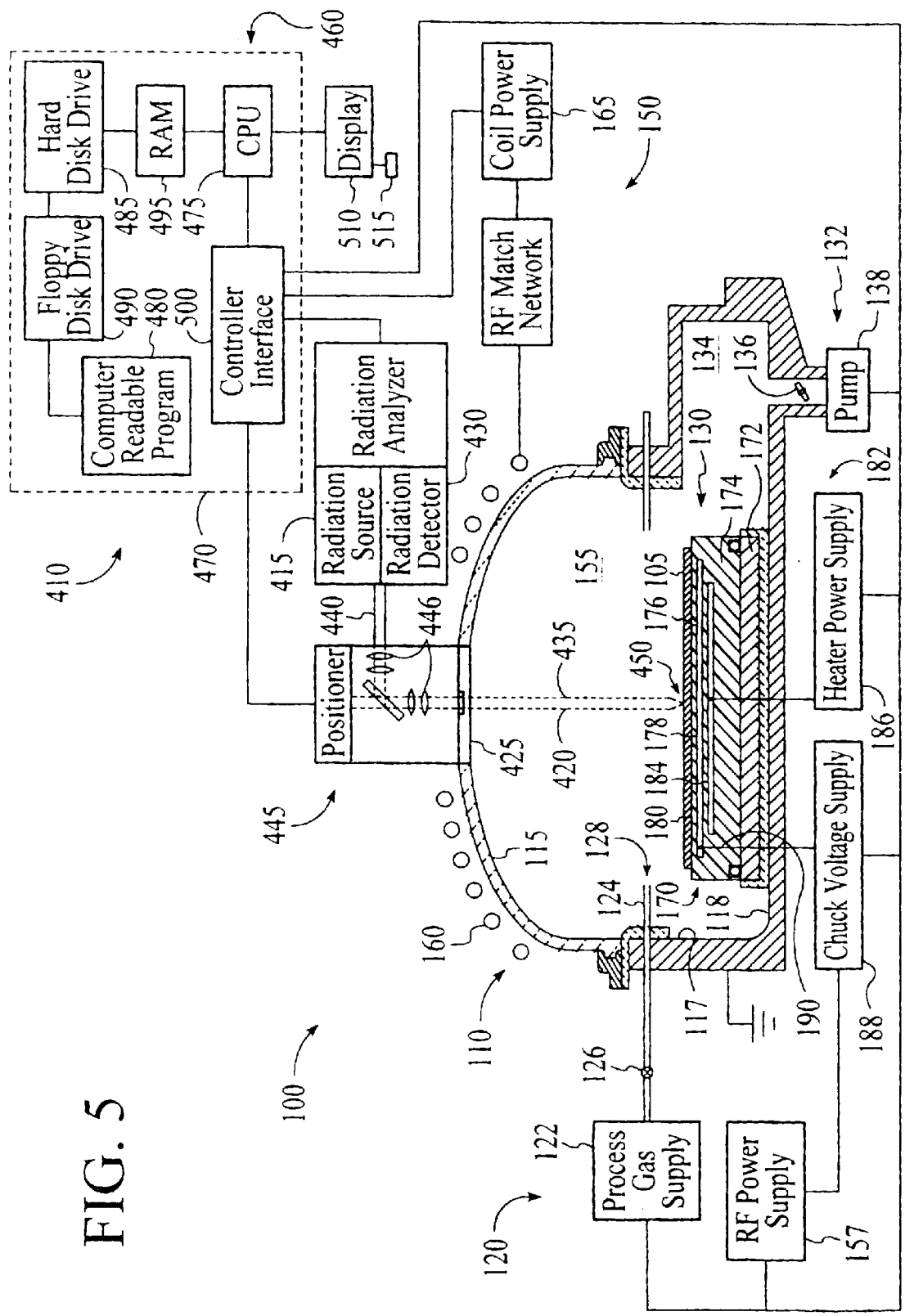
FIG. 5 is a schematic sectional side view of a substrate processing apparatus and endpoint detection system according to the present invention.

To remove sufficient amounts of the resist material 230 without overexposing the substrate 105 to energized stripping gas, the apparatus 100 and chamber 110 may comprise a process monitoring system 410 which may include an endpoint detection system to detect the occurrence of an endpoint of, for example, resist material removal, as shown in FIG. 5. Endpoint detection methods are used to measure the endpoint of a process to prevent over processing of a material by stopping or changing the process conditions when an endpoint is detected. Endpoint measurement techniques include, for example, plasma emission analysis, interferometry, and ellipsometry, which detect radiation emanating from the chamber 110. Plasma emission analysis involves analyzing the emission spectra of energized gas in the process zone 155 to determine a change in chemical composition that corresponds to a change in the chemical composition of the material being etched, as disclosed in U.S. Pat. No. 4,328,068 which is incorporated herein by reference in its entirety. Optical emission detection for endpoint determination is also discussed in Chapter 16, of *Silicon Processing for the VLSI Era. Volume* 1: *Process Technology*, by Stanley Wolf et al., Lattice Press (1986), which is incorporated herein by reference in its entirety. The present invention is useful for monitoring events, such as events related to an endpoint, in an apparatus via a radiation measuring technique.

In the version shown in FIG. 5, the chamber 110 comprises a process monitoring system 410 to monitor the process being performed on the substrate 105. The process monitoring system 410 comprises a radiation source 415 that may be outside or inside the chamber 110. The radiation source 415 may provide radiation such as ultraviolet (UV), visible or infrared radiation; or it may provide other types of radiation such as X-rays. The radiation source 410 may comprise, for example, an emission from an energized gas, such as a plasma, generated inside the chamber 110, the plasma emission being generally multispectral, i.e., providing radiation having multiple wavelengths extending across a spectrum. The radiation source 410 may also be positioned outside the chamber 110 so that a radiation beam 420 may be transmitted from the source 415 through a window 425 and into the chamber 110. The radiation source 415 may also provide radiation having predominant wavelengths, or a single wavelength, such as monochromatic light, for example, a He-Ne or Nd-YAG laser. Alternatively, the radiation source 415 may provide radiation having multiple wavelengths, such as polychromatic light, which may be selectively filtered to a single wavelength. Suitable radiation sources 415 for providing polychromatic light include Hg discharge lamps that generate a polychromatic light spectrum having wavelengths in a range of from about 180 to about 600 nanometers, arc lamps such as xenon or Hg—Xe lamps and tungsten-halogen lamps, and light emitting diodes (LED).

The process monitoring system 410 further comprises a radiation detector 430 for detecting radiation emanating from the chamber 110. For example, the emanating radiation may be from a plasma emission or may be radiation 435 reflected by the substrate 105. The radiation detector 430 may comprise a radiation sensor, such as a photovoltaic cell, photodiode, photomultiplier, or phototransistor, which provides an electrical output signal in response to an emission spectra from the plasma or a measured intensity of reflected radiation 435, for example. The signal may comprise a change in the level of a current passing through an electrical component or a change in a voltage applied across an electrical component. A suitable system for coupling the radiation detector 430 to the chamber 110 comprises a fiberoptic cable 440 leading to the sensor of the radiation detector 430.

Optionally, a lens assembly 445 may be used to focus radiation emitted by the plasma onto the radiation detector 430, to focus a radiation beam 420 emitted by the radiation source 415 onto the substrate 105, or to focus a radiation beam 435 reflected back from the substrate 105 onto the sensor of the radiation detector 430. For example, for a radiation source 415 comprising a Hg-discharge lamp located outside the chamber 110, the lens assembly 445 may comprise a plurality of convex lenses 446 that may be used to focus a radiation beam 420 from the lamp, through the window 425, and as a beam spot 450 on the substrate 105. The area of the beam spot 450 should be sufficiently large to provide an accurate measurement of the surface topography of the substrate 105. The lenses may also be used to focus reflected radiation 435 back onto the sensor of the radiation detector 430 in the reverse direction or may be used to focus radiation from the energized gas to the radiation detector 430 which is especially useful when the radiation source 415 is an emission spectra from a plasma.

The chamber 110 and monitoring system 410 may be operated by a controller 460 that executes a computer-readable process control program on a computer system 470 comprising a central processor unit (CPU) 475, such as for example a 68040 microprocessor, commercially available from Synergy Microsystems, Calif., or a Pentium Processor commercially available from Intel Corporation, Santa Clara, Calif., that is coupled to a memory and peripheral computer components. The memory comprises a computer-readable medium having the computer-readable program 480 embodied therein. Preferably, the memory includes a hard disk drive 485, a removable media drive such as a floppy disk drive 490, a ZIP™ drive, or a CD recordable drive, and random access memory 495. The computer system further comprises a controller interface 500 which may comprise plurality of interface cards including, for example, analog and digital input and output boards, interface boards, and motor controller boards. The interface between an operator and the controller 460 can be, for example, via a display 510 and a light pen 515. The light pen detects light emitted by the monitor with a light sensor in the tip of the light pen. To select a particular screen or function, the operator touches a designated area of a screen on the monitor and pushes the button on the light pen. Typically, the area touched changes color, or a new menu is displayed, confirming communication between the user and the controller 460.

Computer-readable programs such as those stored on other memory including, for example, a floppy disk or other computer program product inserted in a floppy disk drive or other appropriate drive, or stored on the hard drive, may also be used to operate the controller 460. The process control program 600 generally comprises process control software 605 comprising program code to operate the chamber 110 and its components, process monitoring software 610 to monitor the processes being performed in the chamber 110, safety systems software, and other control software. The computer-readable program 600 may be written in any conventional computer-readable programming language, such as for example, assembly language, $C^{++}$, Pascal, or Fortran. Suitable program code is entered into a single file, or multiple files, using a conventional text editor and stored or embodied in computer-usable medium of the memory of the computer system 470. If the entered code text is in a high level language, the code is compiled, and the resultant compiler code is then linked with an object code of pre-compiled library routines. To execute the linked, compiled object code, the user invokes the object code, causing the CPU 475 to read and execute the code to perform the tasks identified in the program.

Figure 6:
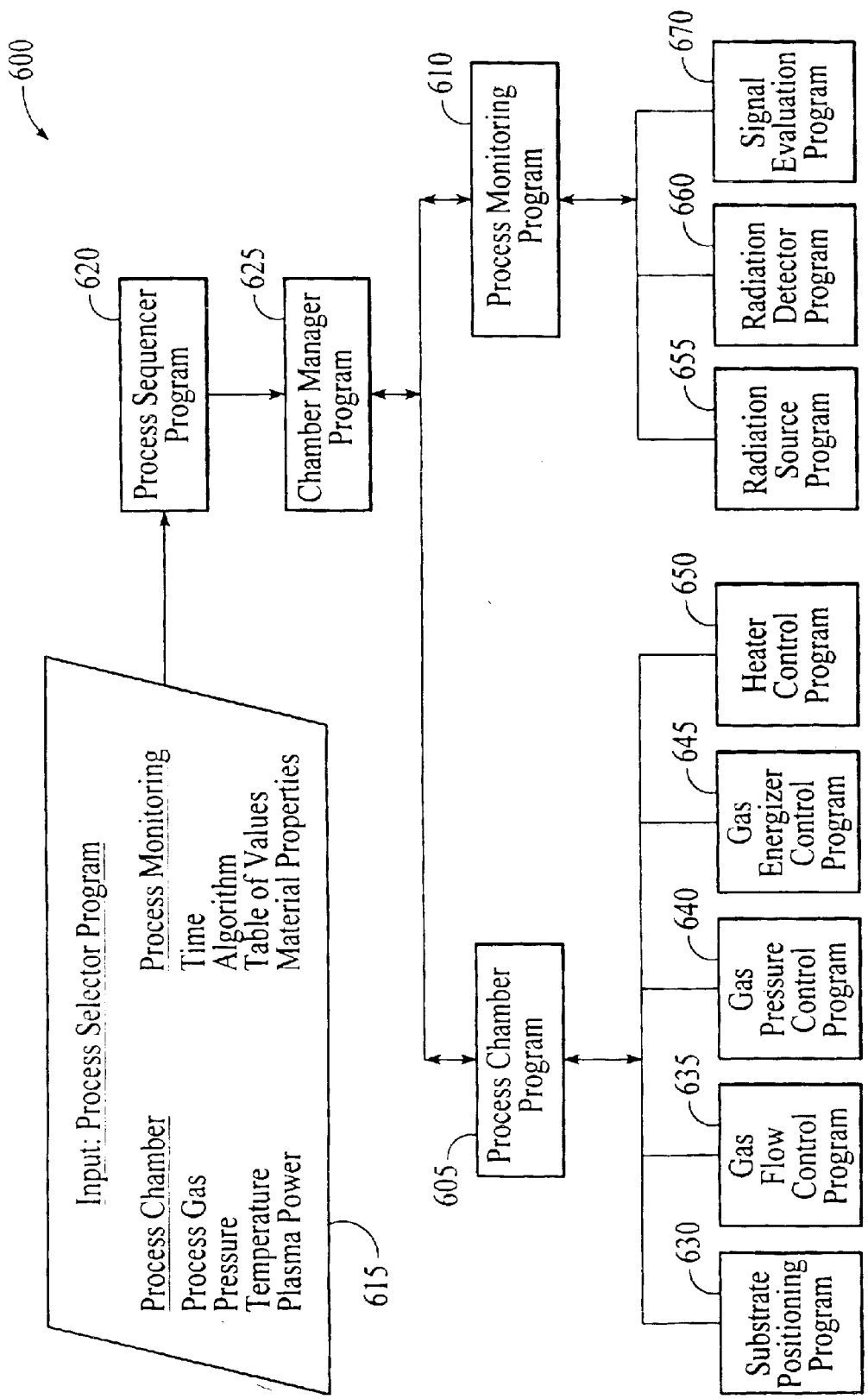
FIG. 6 is an illustrative block diagram of a structure of a computer program suitable for operating the chamber and monitoring a process performed therein.

FIG. 6 is an illustrative block diagram of a hierarchical control structure of a specific embodiment of a process control program 600 according to the present invention. Using a light pen interface, a user enters a process set and chamber number into a process selector program 615 in response to menus or screens displayed on the CRT terminal.

The process chamber program 605 includes program code to set the timing, gas composition, gas flow rates, chamber pressure, chamber temperature, RF power levels, support position, heater temperature, and other parameters of a particular process. The process sets are predetermined groups of process parameters necessary to carry out specified processes. The process parameters are process conditions, including without limitations, gas composition, gas flow rates, temperature, pressure, gas energizer settings such as RF or microwave power levels, cooling gas pressure, and wall temperature. In addition, parameters needed to operate the process monitoring program 610 are input by a user into the process selector program 615. These parameters include known properties of the materials being processed, especially radiation absorption and reflection properties, such as reflectance and extinction coefficients; process monitoring algorithms that are modeled from empirically determined data; tables of empirically determined or calculated values that may be used to monitor the process; and properties of materials being processed on the substrate 105.

The process sequencer program 620 comprises program code to accept a chamber type and set of process parameters from the process selector program 615 and to control its operation. The sequencer program 620 initiates execution of the process set by passing the particular process parameters to a chamber manager program 625 that controls multiple processing tasks in the process chamber 110. Typically, the process chamber program 605 includes, among others, a substrate positioning program 630, a gas flow control program 635, a gas pressure control program 640, a gas energizer control program 645, and a heater control program 650. Typically, the substrate positioning program 630 comprises program code for controlling chamber components that are used to load the substrate 105 onto the support 130 and optionally, to lift the substrate 105 to a desired height in the chamber 110 to control the spacing between the substrate 110 and the gas outlets 128 of the gas delivery system 120. The gas flow control program 635 has program code for controlling the flow rates of different constituents of the process gas. The process gas control program 635 controls the open/close position of the safety shut-off valves, and also ramps up/down a gas flow controller to obtain the desired gas flow rate. The pressure control program 640 comprises program code for controlling the pressure in the chamber 110 by regulating the aperture size of the throttle valve 136 in the exhaust system 132 of the chamber 110. The gas energizer control program 645 comprises program code for setting low and high-frequency RF power levels applied to the process electrodes in the chamber 110 and/or to the inductor coil 160. Optionally, the heater control program 650 comprises program code for controlling the temperature of the heater element 184 used to resistively heat the support 130 and substrate 105.

The process monitoring program 610 comprises program code that obtains sample or reference signals from the radiation source 415 or radiation detector 430 and processes the signal according to preprogrammed criteria. Typically, a radiation amplitude or spectrum trace is provided to the controller 460 by an analog to digital converter board in the radiation detector 430. The process monitoring program 610 may also send instructions to the controller 460 to operate components such as the radiation source 415, radiation detector 430, the lens assembly 445, filters, and other components. The program may also send instructions to the chamber manager program 605 or other programs to change the process conditions or other chamber settings.

To define the parameters of the process monitoring program 610, initially, one or more substrates 105 having predetermined thicknesses of material are selected for processing. Each substrate 105 is placed at one time into the process chamber 110 and process conditions are set to process a material or an underlying material on the substrate 105. Radiation reflected from the substrate and/or emitted from the plasma in the chamber 110 are monitored using one or more radiation detectors 430. After a series of such traces are developed, they are examined to identify a recognizable change in a property of the trace, which is used as input for the computer program, in the form of an algorithm, a table of values, or other criteria for suitable for evaluating an event in the chamber 110 or a property of the substrate 105. For example, the process monitoring program 610 may include program code to evaluate a signal corresponding to an intensity of reflected radiation which may be used to detect both an onset and completion of processing of the substrate 105. As another example, the computer program 600 comprises program code to evaluate first and second signals that correspond to radiation emitted from the plasma and/or reflected from the substrate 105. In one particular version for determining the endpoint of resist material removal, the computer program 600 may comprise program code to evalutate radiation emitted from the energized gas in the process zone 155, particularly radiation having a wavelength of about 4835 angstroms.

Thus, the process monitoring program 610 may comprise program codes to monitor a process, as shown in FIG. 6. For example, the process monitoring program 610 may comprise radiation source program code 655 to analyze the radiation from the radiation source 415, radiation detector program code 660 to analyze an incoming signal trace provided by the radiation detector 430 and determine a process endpoint or completion of a process stage when a desired set of criteria is reached, such as when an attribute of the detected signal is substantially similar to a pre-programmed value, and signal evaluation program code 465 to detect errors or anomalies in the monitored signals. The process monitoring program 610 may also be used to detect a property of a material being processed on the substrate 105 such as a thickness, or other properties, for example, the crystalline nature, microstructure, porosity, electrical, chemical and compositional characteristics of the material on the substrate 105. The computer program 600 may also be programmed to detect both an onset and completion of processing of the substrate 105, for example, by detecting a change in amplitude or a rate of change of amplitude of radiation. The desired criteria are programmed into process monitoring program 610 as preset or stored parameters and algorithms. The program 610 may also include program code for modeling a trace of radiation, selecting a feature from the modeled trace or allowing a user to select the feature, storing the modeled trace or the feature, detecting a portion of an incoming signal from a radiation detector 430, evaluating the measured signal relative to the stored trace or feature, and calling an end of a process stage of the process being performed on the substrate 105 or displaying a measured property of a material on the substrate 105.

In one version, the process monitoring software comprises program code for continuously analyzing a trace of a measured amplitude of reflected radiation by drawing a box or "window" around the end portion of the trace and back in time, with signal height and time length established in the preprogrammed algorithm. A set of windows may be programmed to detect a valley or peak in the trace of the reflected intensity, trigger on an upward slope to detect a later endpoint, or to trigger on a downward slope to detect an endpoint before a valley in the trace. The first criterion is met when the signal in the trace becomes too steep and exits or moves out of the preprogrammed box ("WINDOW OUT") or when it becomes gradual and enters the box ("WINDOW IN"). Additional windows are sequentially applied on the moving trace to generate the complete set of criteria to make a determination on whether the change in signal measured in the real time trace is an endpoint of the process, such as an onset or completion of the process, a change in the property of the material, or is only noise. The direction of entering or exiting a box may also be specified as part of the preprogrammed input criteria for operating the process monitoring program 610. Upon detecting an onset or completion of a process, the process monitoring program signals the process chamber program 605 which sends instructions to the controller 460 to change a process condition in a chamber 110 in which the substrate 105 is being processed.

The data signals received by and/or evaluated by the controller 460 may be sent to a factory automation host computer (not shown). The factory automation host computer may comprise a host software program that evaluates data from several systems, platforms or chambers, and for batches of substrates or over an extended period of time, to identify statistical process control parameters. A suitable host software program comprises a WORKSTREAM™ software program available from aforementioned Applied Materials. The factory automation host computer may be further adapted to provide instruction signals to (i) remove particular substrates from the processing sequence, for example, if a substrate property is inadequate or does not fall within a statistically determined range of values, or if a process parameter deviates from an acceptable range; (ii) end processing in a particular chamber, or (iii) adjust process conditions upon a determination of an unsuitable property of the substrate or process parameter. The factory automation host computer may also provide the instruction signal at the beginning or end of processing of the substrate in response to evaluation of the data by the host software program.

While the present invention has been described in considerable detail with reference to certain preferred versions, many other versions should be apparent to those of ordinary skill in the art. For example, deposition of materials may be monitored for endpoint and etch resistant materials other than resist material may be removed from the substrate in the process zone. Therefore, the spirit and scope of the appended claims should not be limited to the description of the preferred versions contained herein.

What is claimed is:

1. A substrate processing method comprising:
   (a) providing a substrate in a process zone, the substrate comprising an etch resistant material over a mask material, the mask material being over an underlying material;
   (b) providing an energized etching gas in the process zone to etch the mask material, the energized etching as comprising a first composition;
   (c) changing the first composition of the etching gas to a second composition to etch the mask material;
   (d) removing the etch resistant material in the process zone; and
   (e) after (d), providing an energized process gas in the process zone to etch the underlying material.

2. A method according to claim 1 wherein (d) comprises providing an energized stripping gas in the process zone under process conditions selected to substantially remove a layer of etch resistant material.

3. A method according to claim 2 wherein the energized stripping gas comprises an oxygen-containing gas.

4. A method according to claim 3 wherein the energized stripping gas further comprises an oxygen activating gas.

5. A method according to claim 4 wherein the oxygen activating gas comprises a nitrogen-containing gas.

6. A method according to claim 1 comprising etching apertures in the mask material.

7. A method according to claim 1 wherein the underlying material comprises silicon and wherein the energized process gas comprises a halogen-containing gas.

8. A method according to claim 7 wherein the energized process gas comprises one or more of $CF_4$, $C_2F_6$, $NF_3$, $SF_6$, $Cl_2$, $Br_2$, HBr, and HCl.

9. A method according to claim 1 wherein the process zone is an energized gas zone in a process chamber.

10. A substrate processing method comprising:
    (a) providing a substrate in a process zone, the substrate comprising an etch resistant material and a mask material;
    (b) providing a first energized etching gas in the process zone to etch the mask material;
    (c) after (b), providing a second energized etching gas in the process zone to etch the mask material; and
    (d) removing the etch resistant material.

11. A method according to claim 10 wherein the etch resistant material comprises photoresist.

12. A method according to claim 10 comprising forming apertures in the mask material in accordance with a pattern of the etch resistant material.

13. A method according to claim 10 wherein (d) comprises providing an energized stripping gas in the process zone under process conditions selected to substantially remove the etch resistant material.

14. A method according to claim 13 wherein the energized stripping gas comprises an oxygen-containing gas.

15. A method according to claim 10 wherein the substrate comprise a layer under the etch resistant and mask materials and further comprising providing an energized process gas to etch the layer.

16. A method according to claim 10 wherein the substrate comprises a layer under the etch resistant and mask materials and further comprising providing an energized process gas in the process zone to etch the layer.

17. A method according to claim 10 wherein the substrate comprises a layer under the etch resistant and mask materials and further comprising, after (d), providing an energized process gas in the process zone to etch the layer.

18. A method according to claim 17 wherein the layer comprises silicon and wherein the energized process gas comprises a halogen-containing gas.

19. A method according to claim 18 wherein the energized process gas comprises one or more of $CF_4$, $C_2F_6$, $NF_3$, $SF_6$, $Cl_2$, $Br_2$, HBr, and HCl.

20. A method according to claim 10 wherein the process zone is an energized gas zone in a process chamber.

21. A substrate processing method comprising:
    (a) providing a substrate in a process chamber, the substrate comprising an etch resistant material over a mask material;
    (b) providing a first energized process gas in the chamber to etch the mask material, the process gas comprising a polymer forming gas, thereby depositing process residue on surfaces of the process chamber;

(c) providing a second energized process gas in the chamber comprising a non-polymer forming gas to simultaneously etch the mask material and at least partially remove the process residue from the surfaces of the process chamber; and (d) after (c), providing a third energized process gas in the chamber to further process the substrate.

22. A method according to claim 21 wherein (b) comprises providing an energized first process gas in the chamber to form apertures in the mask material on the substrate.

23. A method according to claim 21 wherein (d) comprises etching a material on the substrate.

24. A substrate processing method comprising:

(a) providing a substrate in a process zone, the substrate comprising resist material over mask material;

(b) providing an energized first process gas in the process zone to etch apertures in the mask material;

(c) after (b), providing an energized second process gas in the process zone to etch the apertures in the mask material;

(d) providing an energized process gas in the process zone to remove the resist material; and (e) providing an energized process gas in the process zone to etch a layer under the mask material.

25. A method according to claim 24 wherein (d) comprises providing an energized stripping gas in the process zone under process conditions selected to substantially remove a layer of resist material.

26. A method according to claim 25 wherein the energized stripping gas comprises an oxygen-containing gas.

27. A method according to claim 24 wherein the layer comprises silicon and wherein the energized process gas comprises a halogen-containing gas.

28. A substrate processing method comprising:

(a) providing a substrate in a process zone, the substrate comprising a first etch resistant material, a second etch resistant material, an anti-reflective coating material that is between the first and second etch resistant materials, and a silicon-containing layer that is under the first and second etch resistant materials;

(b) providing a first energized process gas in the process zone to form apertures in the first etch resistant material;

(c) removing the second etch resistant material in the process zone; and (d) providing a second energized process gas in the process zone to simultaneously remove the anti-reflective coating material and etch the silicon-containing layer, the second energized process gas comprising one or more of $CF_4$, $C_2F_6$, $NF_3$, $SF_6$, $Cl_2$, $Br_2$, HBr, and HCl.

29. A substrate processing method comprising:

(a) providing a substrate in a process zone, the substrate comprising a resist material over a mask material, the mask material being over an underlying material;

(b) forming apertures in the mask material by:

(i) in a first step, exposing the mask material to a first energized process gas in the process zone, the first energized process gas being substantially absent a polymer forming gas; and (ii) in a second step, exposing the mask material to a second energized process gas in the process zone, the second energized process gas comprising polymer forming gas;

(c) removing the resist material from the substrate by providing an energized stripping gas in the process zone; and (d) after (c), providing a third energized process gas in the process zone to etch the underlying material.

30. A method according to claim 29 wherein the first step comprises exposing the mask material to etchant gas comprising one or more of $CF_4$, $C_2F_6$, $NF_3$, and $SF_6$, and the second step comprises exposing the mask material to etchant gas comprising one or more of $CHF_3$, $CH_2F_2$, and $CH_3F$.

31. A method according to claim 29 wherein (b) comprises providing a first energized process gas comprising one or more of HCl, $BCl_3$, HBr, $Br_2$, $Cl_2$, $CCl_4$, $SiCl_4$, $SF_6$, $F_2$, $NF_3$, HF, $CF_3$, $CF_4$, $CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_6$, and $CFCl_3$.

32. A method according to claim 29 wherein (c) comprises providing an energized stripping gas comprising one or more of $O_2$, $N_2$, $H_2O$, $NH_3$, $CF_4$, $C_2F_6$, $CHF_3$, $C_3H_2F_6$, $C_2H_4F_2$, and $CH_3F$.

33. A method according to claim 29 wherein (c) comprises providing an energized oxygen-containing stripping gas in the process zone under process conditions selected to substantially remove the resist material.

34. A method according to claim 29 wherein (d) comprises providing third energized process gas comprising one or more of $CF_4$, $C_2F_6$, $NF_3$, $SF_6$, $Cl_2$, $Br_2$, HBr, and HCl.

35. A method according to claim 29 wherein (a) comprises providing a substrate in the process zone, the substrate comprising a resist material over a mask material, the mask material being over a silicon-containing material.

36. A method according to claim 29 wherein (a) comprises providing a substrate in the process zone, the substrate comprising a resist material over a mask material, the mask material comprising one or more of silicon oxide, TEOS, and silicon nitride, and the mask material being over an underlying material.

37. A substrate processing method comprising:

(a) providing a substrate in a process zone, the substrate comprising a photoresist material over a mask material, the mask material comprising one or more of silicon oxide, TEOS, and silicon nitride, and the mask material being over a silicon-containing underlying material;

(b) providing an energized mask etching gas in the process zone to etch the mask material, the mask etching gas having a first composition comprising a non-polymer forming gas;

(c) changing the first composition of the mask etching gas to a second composition comprising a polymer forming gas to etch the mask material;

(d) removing the photoresist material from the substrate by providing an energized stripping gas in the process zone; and (e) after (d), providing an energized halogen-containing process gas in the process zone to etch the silicon-containing material.

38. A method according to claim 37 wherein (c) comprises providing a second gas composition comprising one or more of HCl, $BCl_3$, HBr, $Br_2$, $Cl_2$, $CCl_4$, $SiCl_4$, $SF_6$, $F_2$, $NF_3$, HF, $CF_3$, $CF_4$,$CH_3F$, $CHF_3$, $C_2H_2F_2$, $C_2H_4F_6$, $C_2F_6$, $C_3F_8$, $C_4F_8$, $C_2HF_5$, $C_4F_{10}$, $CF_2Cl_2$, and $CFCl_3$.

39. A method according to claim 37 wherein (d) comprises providing an energized stripping gas in the process zone, the stripping gas comprising one or more of $O_2$, $N_2$, $H_2O$, $NH_3$, $CF_4$, $C_2F_0$, $CHF_3$, $C_3H_2F_6$, $C_2H_4F_2$, and $CH_3F$.

40. A method according to claim 37 wherein (d) comprises providing an energized oxygen-containing stripping gas in the process zone.

41. A method according to claim 37 wherein (e) comprises providing an energized halogen-containing process gas comprising one or more of $CF_4$, $C_2F_6$, $NF_3$, $SF_6$, $Cl_2$, $Br_2$, HBr, and HCl.

42. A substrate processing method comprising:
(a) providing a substrate in a process zone, the substrate comprising a resist material over a mask material, the mask material comprising one or more of silicon oxide, TEOS, and silicon nitride, the mask material being over a silicon-containing material, and an anti-reflective coating material that is between the resist material and mask material;
(b) providing an energized first mask etching gas in the process zone to etch apertures in the mask material, the energized first mask etching gas comprising one or more of $CF_4$, $C_2F_6$, $NF_3$ and $SF_6$;
(c) after (b), providing an energized second mask etching gas in the process zone to etch the apertures, the energized second mask etching gas comprising one or more of $CHF_3$, $CH_2F_2$, and $CH_3F$, $CF_2Cl_2$, and $CF_3$;
(c) removing the resist material from the substrate by providing an energized stripping gas in the process zone, the stripping gas comprising one or more of $O_2$, $N_2$, $H_2O$, $NH_3$, $CF_4$, $C_2F_6$, $CHF_3$, $C_3H_2F_6$, $C_2H_4F_2$, and $CH_3F$; and
(d) after (c), providing an energized process gas in the process zone to simultaneously remove the anti-reflective coating material and etch the silicon-containing material, the process gas comprising one or more of $CF_4$, $C_2F_6$, $NF_3$, $SF_6$, $Cl_2$, $Br_2$, HBr, and HCl.

43. A substrate processing method comprising:
(a) providing a substrate in a process zone, the substrate comprising a resist material over a mask material, the mask material being over an underlying material;
(b) forming apertures in the mask material by:
  (i) in a first step, exposing the mask material to a first energized process gas in the process zone, the energized first process gas comprising one or more of $CF_4$, $C_2F_6$, $NF_3$, and $SF_6$; and
  (ii) in a second step, exposing the mask material to a second energized process gas in the process zone, and energized second process gas comprising one or more of $CHF_3$, $CH_2F_2$, and $CH_3F$;
(c) removing the resist material from the substrate by providing an energized stripping gas in the process zone; and
(d) after (c), providing a third energized process gas in the process zone to etch the underlying material.

44. A method according to claim 1 wherein the first composition comprises a non-polymer forming gas, the second composition comprises a polymer. forming gas, and wherein (c) comprises changing to the second composition without stopping a flow of the non polymer forming gas.

45. A method according to claim 1 wherein the first composition is substantially absent polymer forming gas.

46. A method according to claim 1 wherein the first composition comprises one or more of $CF_4$, $C_2F_6$, $NF_3$, and $SF_6$, and wherein the second composition comprises one or more of $CHF_3$, $CH_2F_2$, and $CH_3F$.

47. A method according to claim 1 wherein the first composition consists essentially of $CF_4$ and argon, and wherein the second composition consists essentially of (i) $CF_4$, (ii) one or more of $CHF_3$, $CH_2F_2$, and $CH_3F$, and (iii) argon.

48. A method according to claim 10 wherein the first energized etching gas comprises a first composition comprising a non-polymer forming gas and the second energized etching gas comprises second composition comprising a polymer forming gas, and wherein (c) comprises changing the first composition to the second composition without stopping a flow of the non-polymer forming gas.

49. A method according to claim 10 wherein the first energized etching gas comprises one or more of $CF_4$, $C_2F_5$, $NF_3$, and $SF_6$, and wherein the second energized etching gas comprises one or more of $CHF_3$, $CH_2F_2$, and $CH_3F$.

50. A method according to claim 21 wherein the first energized process gas comprises one or more of $CHF_3$, $CH_2F_2$, and $CH_3F$, and wherein the second energized process gas comprises one or more of $CF_4$, $C_2F_6$, $NF_3$, and $SF_6$.

51. A method according to claim 24 wherein the energized first process gas comprises a first composition comprising a non-polymer forming gas, and wherein the energized second process gas comprises a second composition comprising a polymer forming gas, and wherein (c) comprises changing the first composition to the second composition without stopping a flow of the non-polymer forming gas.

52. A method according to claim 29 wherein the first energized process gas comprises a first composition comprising a non-polymer forming gas, and the second energized process gas comprises a second composition, and comprising changing the first composition to the second composition without stopping a flow of the non-polymer forming gas.

53. A method according to claim 37 wherein (c) comprises changing the first composition to the second composition without stopping a flow of the non-polymer forming gas.

54. A method according to claim 42 wherein the energized first mask etching gas comprises a first gas composition comprising a non-polymer forming gas, the energized second mask etching gas comprises a second gas composition, and wherein the first gas composition is changed to the second composition without stopping a flow of the non-polymer forming gas.

* * * * *